(12) United States Patent
Sarin et al.

(10) Patent No.: US 7,596,037 B2
(45) Date of Patent: Sep. 29, 2009

(54) INDEPENDENT BI-DIRECTIONAL MARGIN CONTROL PER LEVEL AND INDEPENDENTLY EXPANDABLE REFERENCE CELL LEVELS FOR FLASH MEMORY SENSING

(75) Inventors: Vishal Sarin, Cupertino, CA (US); Hieu Van Tran, San Jose, CA (US); William John Saiki, Mountain View, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 76 days.

(21) Appl. No.: 11/855,801

(22) Filed: Sep. 14, 2007

(65) Prior Publication Data
US 2009/0073770 A1    Mar. 19, 2009

(51) Int. Cl.
    *G11C 5/14* (2006.01)

(52) U.S. Cl. .............................. 365/189.09; 365/185.03; 365/185.2; 365/185.22; 365/189.02

(58) Field of Classification Search ............ 365/185.03, 365/185.2–185.22, 189.09
See application file for complete search history.

(56) References Cited

U.S. PATENT DOCUMENTS

| | | | |
|---|---|---|---|
| 6,396,742 B1 * | 5/2002 | Korsh et al. ............ | 365/185.22 |
| 6,687,155 B2 * | 2/2004 | Nagasue ................ | 365/185.03 |
| 2009/0003073 A1 * | 1/2009 | Rizel et al. ............. | 365/185.18 |

* cited by examiner

*Primary Examiner*—VanThu Nguyen
*Assistant Examiner*—R Lance Reidlinger
(74) *Attorney, Agent, or Firm*—DLA Piper LLP (US)

(57) ABSTRACT

A memory system includes reference level generators that may provide programmable margins, and programmable verify voltage levels. The reference levels may be shifted within a range of voltages with varying differences between reference voltage levels and with different margins and verify levels.

12 Claims, 14 Drawing Sheets

US 7,596,037 B2

INDEPENDENT BI-DIRECTIONAL MARGIN CONTROL PER LEVEL AND INDEPENDENTLY EXPANDABLE REFERENCE CELL LEVELS FOR FLASH MEMORY SENSING

BACKGROUND OF THE INVENTION

The present invention relates to multilevel memory system, and more particularly relates to adjustable reference and margin levels for multilevel memory systems.

As information technology progresses at an unprecedented pace, the need for information storage increases proportionately. Accordingly, the non volatile information in stationary or portable communication demands higher capability and capacity storage. One approach to increasing the amount of storage is by decreasing physical dimensions of the stored bit (e.g., memory cell) to smaller dimensions such as nanocell technology. Another approach is to increase the storage density per bit. The second approach is known as digital multi-level nonvolatile storage technology. A sense amplifier reads the content of a memory cell by comparison to reference levels. As more bits are stored in a multilevel memory cell, the voltage separation of reference level cells decreases. Variation within the memory cell, the sense amplifier, and other circuits may change reference levels to cause erroneous detection of the content of a memory cell.

SUMMARY OF THE INVENTION

The present invention provides a multi level memory system that includes adjustment of reference cell windows and margins. The voltage mode reference cell window adjustment may be a bi-directional cell window adjustment, independently expandable individual levels with absolute voltage reference levels, or independent bi-directional margin control per level and with relative margin levels per window.

DETAILED DESCRIPTION

A digital multilevel memory system includes a reference voltage generator that generates reference voltages for memory operations. The reference voltages may have adjustable voltage levels and adjustable relative margin levels.

Figure 1:
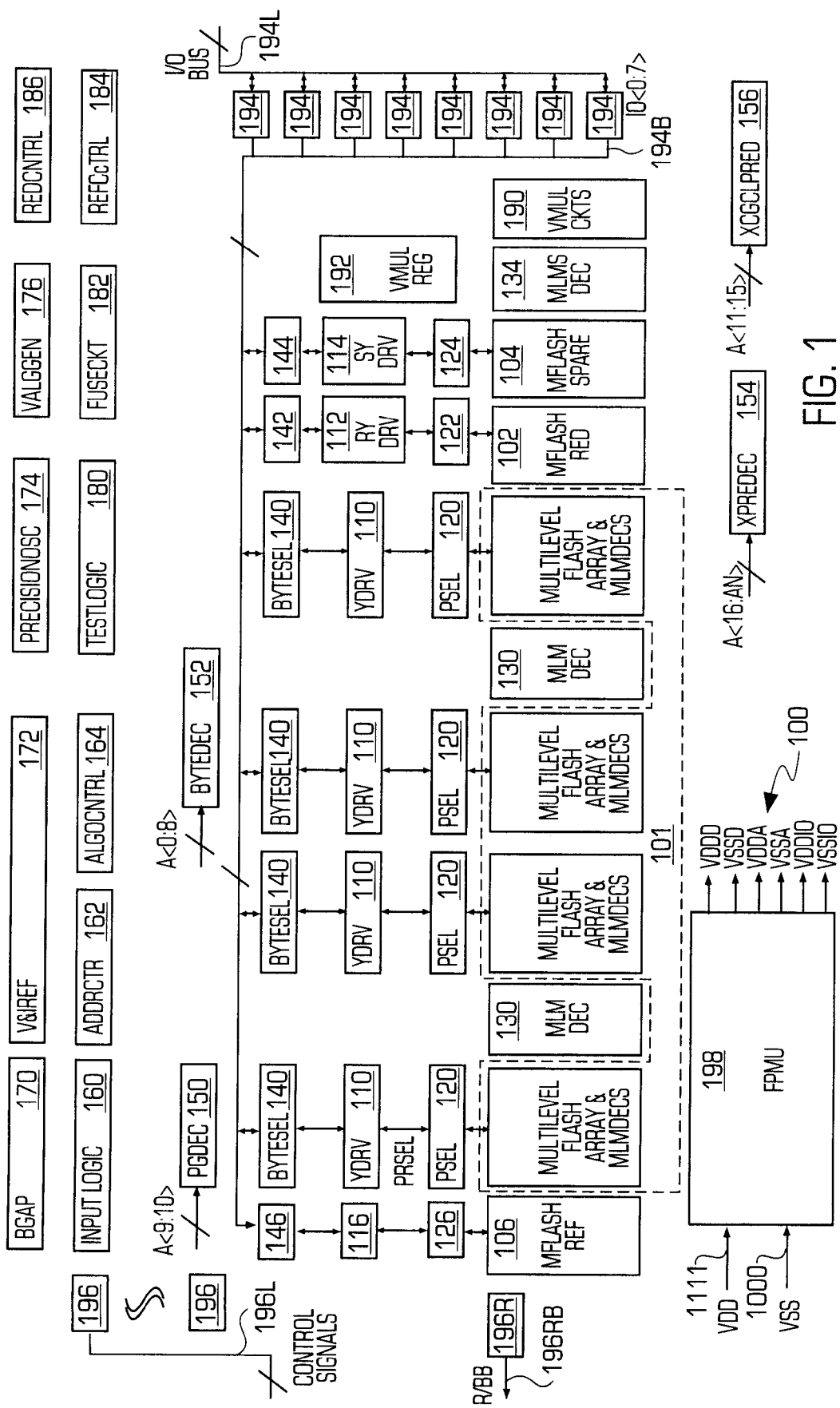
FIG. 1 is a block diagram illustrating a digital multilevel bit memory array system.

FIG. 1 is a block diagram illustrating a digital multilevel bit memory array system 100. For clarity, some signal lines of the memory array system 100 are not shown in FIG. 1.

In one embodiment, the memory array includes a source side injection flash technology, which uses lower power in hot electron programming, and efficient injector based Fowler-Nordheim tunneling erasure. The programming may be done by applying a high voltage on the source of the memory cell, a bias voltage on the control gate of the memory cell, and a bias current on the drain of the memory cell. The programming in effect places electrons on the floating gate of memory cell. The erase is done by applying a high voltage on the control gate of the memory cell and a low voltage on the source and/or drain of the memory cell. The erase in effect removes electrons from the floating gate of memory cell. The verify (sensing or reading) is done by placing the memory cell in a voltage mode sensing, e.g., a bias voltage on the source, a bias voltage on the gate, a bias current coupled from the drain (bitline) to a low bias voltage such as ground, and the voltage on the drain is the readout cell voltage VCELL. The bias current may be independent of the data stored in the memory cell. In another embodiment, the verify (sensing or reading) is done by placing the memory cell in a current mode sensing, e.g., a low voltage on the source, a bias voltage on the gate, a load (resistor or transistor) coupled to the drain (bitline) from a high voltage supply, and the voltage on the load is the readout voltage. In one embodiment, the array architecture and operating methods may be one or more of those disclosed in U.S. Pat. No. 6,282,145, entitled "Array Architecture and Operating Methods for Digital Multilevel Nonvolatile Memory Integrated Circuit System" by Tran et al., U.S. Pat. No. 7,139,196, entitled "Sub-Volt Sensing For Digital Multilevel Flash Memory" by Tran, and U.S. patent application Ser. No. 11/235,901, U.S. Published Patent Application 2007/0070703 A1, entitled "Flash Memory Array System including Top Gate Memory Cell" by Tran et al, the subject matter of which are incorporated herein by reference.

The digital multilevel bit memory array system 100 includes a plurality of regular memory arrays 101, a plurality of redundant memory arrays (MFLASHRED) 102, a spare array (MFLASHSPARE) 104, and a reference array (MFLASHREF) 106. An N-bit digital multilevel cell is defined as a memory cell capable of storing $2^N$ levels.

In one embodiment, the memory array system 100 stores one gigabits of digital data with 4-bit multilevel cells, and the regular memory arrays 101 are equivalently organized as 8,192 columns and 32,768 rows. Addresses A<12:26> are used to select a row, and addresses A<0:11> are used to select two columns for one byte. A page is defined as a group of 512 bytes corresponding to 1,024 columns or cells on a selected row. A page is selected by the A<9:11> address. A row is defined here as including 8 pages. A byte within a selected page is selected by the address A<0:8>. Further, for each page of 512 regular data bytes, there are 16 spare bytes that are selected by the address A<0:3>, which are enabled by other control signals to access the spare array and not the regular array as is normally the case. Other organizations are possible such as a page including 1024 bytes or a row including 16 or 32 pages.

The reference array (MFLASHREF) 106 is used for a reference system of reference voltage levels to verify the contents of the regular memory array 101. In another embodiment, the regular memory arrays 101 may include reference memory cells for storing the reference voltage levels.

The redundancy array (MFLASHRED) 102 is used to increase production yield by replacing bad portions of the regular memory array 101.

The spare array (MFLASHSPARE) 104 may be used for extra data overhead storage such as for error correction and/or memory management (e.g., status of a selected block of memory being erased or programmed, number of erase and program cycles used by a selected block, or number of bad bits in a selected block). In another embodiment, the digital multilevel bit memory array system 100 does not include the spare array 104.

The digital multilevel bit memory array system 100 further includes a plurality of y-driver circuits 110, a plurality of redundant y-driver circuits (RYDRV) 112, a spare y-driver circuit (SYDRV) 114, and a reference y-driver (REFYDRV) circuit 116.

The y-driver circuit (YDRV) 110 controls bit lines (also known as columns, not shown in FIG. 1) during write, read, and erase operations. Each y-driver (YDRV) 110 controls one bitline at a time. Time multiplexing may be used so that each y-driver 110 controls multiple bit lines during each write, read, and erase operation. The y-driver circuits (YDRV) 110 are used for parallel multilevel page writing and reading to speed up the data rate during write to and read from the regular memory array 101. In one embodiment, for a 512-byte page with 4-bit multilevel cells, there are a total of 1024 y-drivers 10 or a total of 512 y-drivers 300.

The reference y-driver circuit (REFYDRV) 116 is used for the reference array (MFLASHREF) 106. In one embodiment, for a 4-bit multilevel cell, there are a total of 15 or 16 reference y-drivers 116. The function of the reference y-driver 116 may be similar to that of the y-driver circuit 110.

The redundant y-driver circuit (RYDRV) 112 is used for the redundant array (MFLASHRED) 102. The function of redundant y-driver circuit (RYDRV) 112 may be similar to that of the y-driver circuit (YRDRV) 110.

The spare y-driver circuit (SYDRV) 114 includes a plurality of single spare y-drivers (SYDRV) 114 used for the spare array (MFLASHSPARE) 104. The function of the spare y-driver circuit (SYDRV) 114 may be similar to the function of the y-driver circuit (YDRV) 110. In one embodiment, for a 512-byte page with 4-bit multilevel cells with 16 spare bytes, there are a total of 32 spare y-drivers 114.

The digital multilevel bit memory array system 100 further includes a plurality of page select (PSEL) circuits 120, a redundant page select circuit 122, a spare page select circuit 124, a reference page select circuit 126, a plurality of block decoders (BLKDEC) 130, a multilevel memory precision spare decoder (MLMSDEC) 134, a byte select circuit (BYTESEL) 140, a redundant byte select circuit 142, a spare byte select circuit 144, a reference byte select circuit 146, a page address decoder (PGDEC) 150, a byte address decoder (BYTEDEC) 152, an address pre-decoding circuit (X PREDEC) 154, an address pre-decoding circuit (XCGCLPRE1) 156, an input interface logic (INPUTLOGIC) 160, and an address counter (ADDRCTR) 162.

The page select circuit (PSEL) 120 selects one bit line (not shown) out of multiple bitlines for each single y-driver (YDRV) 110. In one embodiment, the number of multiple bitlines connected to a single y-driver (YDRV) 110 is equal to the number of pages. The corresponding select circuits for the reference array 106, the redundant memory array 102, and the spare memory array 104 are the reference page select circuit 126, the redundant page select circuit 122, and the spare page select circuit 124, respectively.

The byte select circuit (BYTESEL) 140 enables one byte data in or one byte data out of a pair of the y-driver circuits (YDRV) 110 at a time. The corresponding byte select circuits for the reference array 106, the redundant memory array 102, and the spare memory array 104 are the reference byte select circuit 146, the redundant byte select circuit 142, and the spare byte select circuit 144, respectively.

The block decoder (BLKDEC) 130 selects a row or a block of rows in the arrays 101 and 102 based on the signals from the address counter 162 (described below) and provides precise multilevel bias values over temperature, process, and power supply used for consistent single level or multilevel memory operation for the regular memory array 101 and the redundant memory array 102. The multilevel memory precision spare decoder (MLMSDEC) 134 selects a spare row or block of spare rows in the spare array 104 and provides precise multilevel bias values over temperature, process corners, and power supply used for consistent multilevel memory operation for the spare array 104. The intersection of a row and column selects a cell in the memory array. The intersection of a row and two columns selects a byte in the memory array.

The address pre-decoding circuit 154 decodes addresses. In one embodiment, the addresses are A<16:26> to select a block of memory array with one block comprising 16 rows. The outputs of the address pre-decoding circuit 154 are coupled to the block decoder 130 and the spare decoder 134. The address pre-decoding circuit 156 decodes addresses. In one embodiment, the addresses are addresses A<12:15> to select one row out of sixteen within a selected block. The outputs of address pre-decoding circuit 156 are coupled to the block decoder 130 and the spare decoder 134.

The page address decoder 150 decodes page addresses, such as A<9:11>, to select a page, e.g., P<0:7>, and provides its outputs to the page select circuits 120, 122, 124, and 126. The byte address decoder 152 decodes byte addresses, such as A<0:8>, and provides its outputs to the byte select circuit 140 to select a byte. The byte predecoder 152 also decodes spare byte address, such as A<0:3> and AEXT (extension address), and provides its outputs to the spare byte select circuit 144 to select a spare byte. A spare byte address control signal AEXT is used together with A<0:3> to decode addresses for the spare array 104 instead of the regular array 101.

The address counter (ADDRCTR) 162 provides addresses A<11:AN>, A<9:10>, and A<0:8> for row, page, and byte addresses, respectively. The outputs of the address counter (ADDRCTR) 162 are coupled to circuits 154, 156, 150, and 152. The inputs of the address counter (ADDRCTR) 162 are coupled from the outputs of the input interface logic (INPUTLOGIC) 160.

The input interface logic circuit (INPUTLOGIC) 160 provides an external interface to external systems, such as an external system microcontroller. Typical external interface for memory operations are read, write, erase, status read, identification (ID) read, ready busy status, reset, and other general purpose tasks. A serial interface can be used for the input interface to reduce pin counts for a high-density chip due to a large number of addresses. Control signals (not shown) couple the input interface logic circuit (INPUT-LOGIC) 160 to the external system microcontroller. The input interface logic circuit (INPUTLOGIC) 160 includes a status register that indicates the status of the memory chip operation such as pass or fail in program or erase, ready or busy, write protected or unprotected, cell margin good or bad, restore or no restore, and the like.

The digital multilevel bit memory array system 100 further includes an algorithm controller (ALGOCNTRL) 164, a bandgap voltage generator (BGAP) 170, a voltage and current bias generator (V&IREF) 172, a precision oscillator (OSC) 174, a voltage algorithm controller (VALGGEN) 176, a test logic circuit (TESTLOGIC) 180, a fuse circuit (FUSECKT) 182, a reference control circuit (REFCNTRL) 184, a redundancy controller (REDCNTRL) 186, voltage supply and regulator (VMULCKTS) 190, a voltage multiplexing regulator (VMULREG) 192, input/output (IO) buffers 194, and an input buffer 196.

The algorithm controller (ALGOCNTRL) 164 is used to handshake the input commands from the input logic circuit (INPUTLOGIC) 160 and to execute the multilevel erase, programming and sensing algorithms used for multilevel nonvolatile operation. The algorithm controller (ALGOCNTRL) 164 is also used to algorithmically control the precise bias and timing conditions used for multilevel precision programming.

The test logic circuit (TESTLOGIC) 180 tests various electrical features of the digital circuits, analog circuits, memory circuits, high voltage circuits, and memory array. The inputs of the test logic circuit (TESTLOGIC) 180 are coupled from the outputs of the input interface logic circuit (INPUTLOGIC) 160. The test logic circuit (TESTLOGIC) 180 also provides timing speed-up in production testing such as in faster write/read and mass modes. The test logic circuit (TESTLOGIC) 180 also provides screening tests associated with memory technology such as various disturb and reliability tests. The test logic circuit (TESTLOGIC) 180 also allows an off-chip memory tester to directly take over the control of various on-chip logic and circuit bias circuits to provide various external voltages and currents and external timing. This feature permits, for example, screening with external voltage and external timing or permits accelerated production testing with fast external timing. The test logic circuit 180 may include test circuits such as those described below in conjunction with FIGS. 4-10.

The fuse circuit (FUSECKT) 182 is a set of nonvolatile memory cells configured at the external system hierarchy, at the tester, at the user, or on chip on-the-fly to achieve various settings. These settings can include precision bias values, precision on-chip oscillator frequency, programmable logic features such as write-lockout feature for portions of an array, redundancy fuses, multilevel erase, program and read algorithm parameters, or chip performance parameters such as write or read speed and accuracy.

The reference control circuit (REFCNTRL) 184 is used to provide precision reference levels for precision voltage values used for multilevel programming and sensing. The redundancy controller (REDCNTRL) 186 provides redundancy control logic.

The voltage algorithm controller (VALGGEN) 176 provides various specifically shaped voltage signals of amplitude and duration used for multilevel nonvolatile operation and to provide precise voltage values with tight tolerance, used for precision multilevel programming, erasing, and sensing. A bandgap voltage generator (BGAP) 170 provides a precise voltage value over process, temperature, and supply for multilevel programming and sensing.

The voltage and current bias generator (V&IREF) 172 is a programmable bias generator. The bias values are programmable by the settings of control signals from the fuse circuit (FUSECKT) 182 and also by various metal options. The oscillator (OSC) 174 is used to provide accurate timing for multilevel programming and sensing.

The input buffer 196 provides buffers for input/output with the memory array system 100. The input buffer 196 buffers an input/output line 197 coupled to an external circuit or system, and an input/output bus 194B, which couples to the arrays 101, 102, 104, and 106 through the y-drivers 110, 112, 114, and 116, respectively. In one embodiment, the input buffer 196 includes TTL input buffers or CMOS input buffers. In one embodiment, the input buffer 196 includes an output buffer with slew rate control or an output buffer with value feedback control. Input/output (IO) buffer blocks 194 include typical input buffers and typical output buffers. A typical output buffer is, for example, an output buffer with slew rate control, or an output buffer with level feedback control. A circuit block 196R is an open drained output buffer and is used for ready busy handshake signal (R/RB) 196RB.

The voltage supply and regulator (VMULCKT) 190 provides regulated voltage values above or below the external power supply used for erase, program, read, and production tests. In one embodiment, the voltage supply and regulator 190 includes a charge pump or a voltage multiplier. The voltage multiplying regulator (VMULREG) 192 provides regulation for the regulator 190 for power efficiency and for transistor reliability such as to avoid various breakdown mechanisms.

The system 100 may execute various operations on the memories 101, 102, 104, and 106. An erase operation may be done to erase all selected multilevel cells by removing the charge on selected memory cells according to the operating requirements of the non-volatile memory technology used. A data load operation may be used to load in a plurality of bytes of data to be programmed into the memory cells, e.g., 0 to 512 bytes in a page. A read operation may be done to read out in parallel a plurality of bytes of data if the data (digital bits), e.g., 512 bytes within a page, stored in the multilevel cells. A program operation may be done to store in parallel a plurality of bytes of data in (digital bits) into the multilevel cells by placing an appropriate charge on selected multilevel cells depending on the operating requirements of the non-volatile memory technology used. The operations on the memory may be, for example, the operations described in U.S. Pat. No. 6,282,145, incorporated herein by reference above.

Control signals (CONTROL SIGNALS) 196L, input/output bus (IO BUS) 194L, and ready busy signal (R/BB) 196RB are for communication with the system 100.

A flash power management circuit (FPMU) 198 manages power on-chip such as powering up only the circuit blocks in use. The flash power management circuit 198 also provides isolation between sensitive circuit blocks from the less sensitive circuit blocks by using different regulators for digital power (VDDD)/(VSSD), analog power (VDDA) (VSSA), and IO buffer power (VDDIO)/(VSSIO). The flash power management circuit 198 also provides better process reliability by stepping down power supply VDD to lower levels required by transistor oxide thickness. The flash power management circuit 198 allows the regulation to be optimized for each circuit type. For example, an open loop regulation could be used for digital power since highly accurate regulation is not required; and a closed loop regulation could be used for analog power since analog precision is normally required.

The flash power management also enables creation of a "green" memory system because power is efficiently managed.

Figure 2:
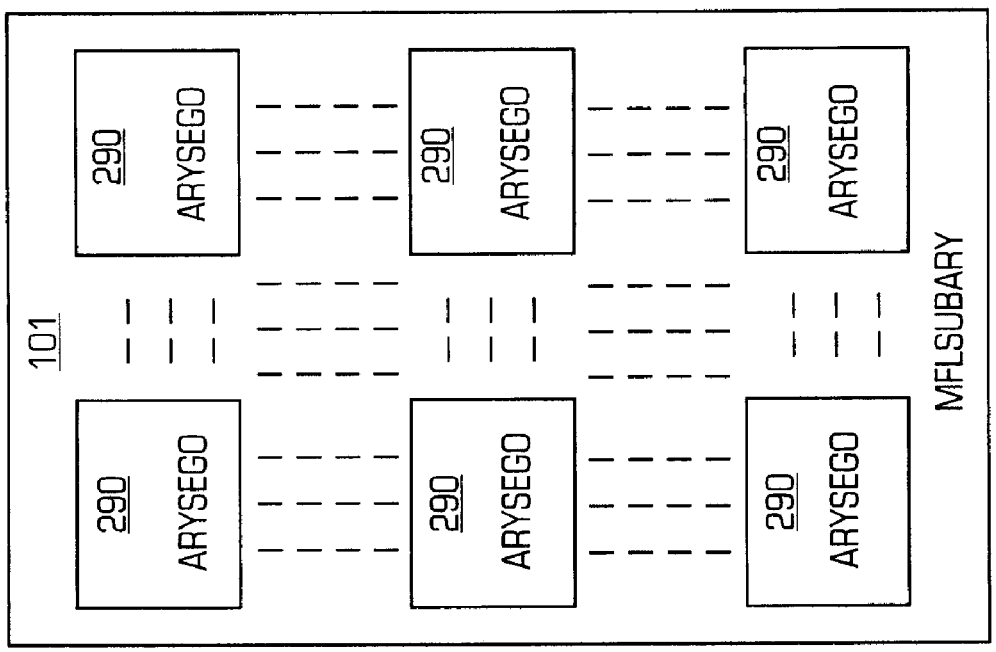
FIG. 2 is a block diagram illustrating a block of a memory array of the digital multilevel bit memory array system of FIG. 1.

FIG. 2 is a block diagram illustrating a block of a memory array 101.

A block (MFLSUBARY) 101 includes a plurality of blocks (ARYSEG0) 290. Blocks (ARYSEG0) 290 are first tiled horizontally NH times and then the horizontally tiled blocks 290 are tiled vertically NV times. For a page with 1024 memory cells, NH is equal to 1024. NV is determined such that the total number of memory cells is equal to the size of the desired physical memory array.

The blocks 290 comprise a plurality of memory arrays that may be arranged in rows and columns. Sense amplifiers may be disposed locally in a block 290 or globally in the memory array 101 or a combination of both.

Figure 3:
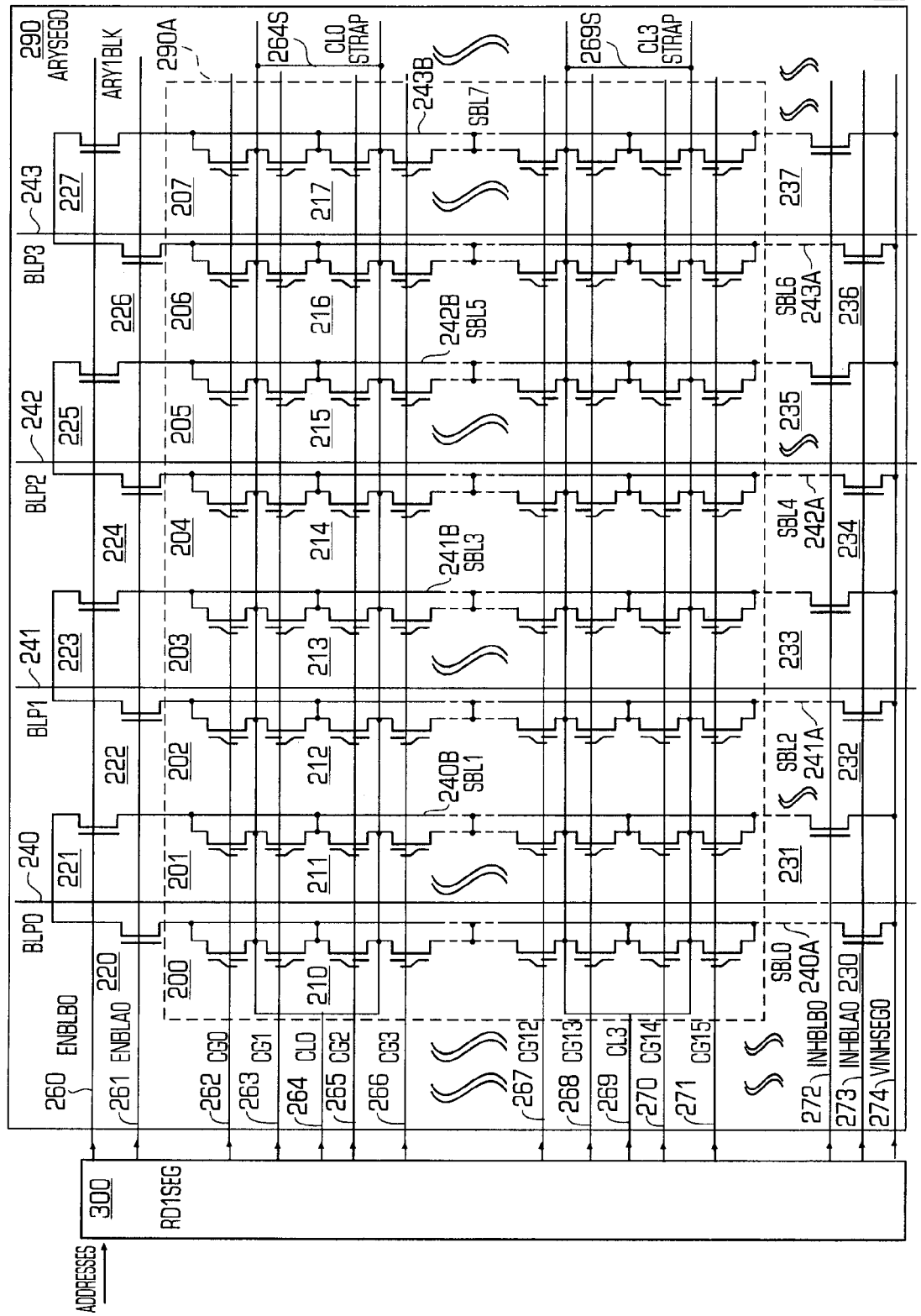
FIG. 3 is a schematic diagram illustrating an array segment of the block of the memory array of FIG. 2.

FIG. 3 is a schematic diagram illustrating an array segment 290.

A plurality of blocks (RD1SEG) 300 are multi-level decoders and comprise a portion of the decoder (MLMDEC) 130 (FIG. 1). In the block (ARYSEG0) 290, there are 8 columns and FIG. 3 shows only 8 rows of memory cells, while other rows, e.g., 120 rows, are not shown for clarity. Each ARYSEG0 290 includes a plurality, e.g. 8, of array blocks (ARYLBLK) 290A tiled vertically. A set of transistors 220, 221, 222, 223, 224, 225, 226, 227 couples a set of segment bitlines (SBLO) 240A and (SBL1) 240B, (SBL2) 241A and (SBL3) 241B, (SBL4) 242A and (SBL5) 242B, (SBL6) 243A and (SBL7) 243B, respectively, to a set of top bitlines (BLP0) 240, (BLP1) 242, (BLP2) 242, and (BLP3) 243, respectively. Top bitlines refer to bitlines running on top of the whole array and running the length of the MFLSUBARY 101. Segment bitlines refer to bitlines running locally within a basic array unit ARYSEG0 290. A set of transistors 230, 231, 232, 233, 234, 235, 236, 237 couples respectively segment bitlines (SBL0) 240A and (SBL1) 240B, (SBL2) 241A and (SBL3) 241B, (SBL4) 242A and (SBL5) 242B, (SBL6) 243A and (SBL7) 243B to an inhibit line (VINHSEGO) 274. A line (CL0) 264 is the common line coupled to common lines of the first four rows of memory cells. A line (CL3) 269 couples to common lines of the last four rows of memory cells. A set of control gates (CG0) 262, (CG1) 263, (CG2) 265, (CG3) 266 couples to control gates of memory cells of the first four rows respectively. A set of control gates (CG12) 267, (CG13) 268, (CG14) 270, (CG15) 271 couples to control gates of memory cells of the last four rows, respectively. A pair of inhibit select lines INHBLB0 272 and INHBLB1 273 couples to gates of transistors 231, 233, 235, 237 and transistors 230, 232, 234, 236 respectively. A pair of bitline select lines (ENBLB0) 260 and (ENBLA0) 261 couples to gates of transistors 221, 223, 225, 227 and transistors 220, 222, 224, 226, respectively.

Multiple units of the basic array unit (ARYSEG0) 290 are tiled together to make up one sub-array (MFLSUBARY) 101 as shown in FIG. 2. And multiples of such (MFLSUBARY) 101 are tiled horizontally to make up the final 8192 columns for a total of 32768'8192=268,435,460 physical memory cells, or called 256 mega cells. The logical array size is 256 mega cells×4 bits per cell=1 giga bits if 4-bit digital multilevel memory cell is used or 256 mega cells×8 bits per cell=2 giga bits if 8-bit digital multilevel memory cell is used. The top bitlines (BLP0) 240, (BLP1) 241, (BLP2) 242, and (BLP3) 243 run from the top of the array to the bottom of the array. The segment bitlines (SBL0) 240A, (SBL1) 240B, (SBL2) 241A, (SBL3) 241B, (SBL4) 242A, (SBL5) 242B, (SBL6) 243A, and (SBL7) 243B only run as long as the number of rows within a segment, for example, 128 rows. Hence the capacitance contributed from each segment bitline is very small, e.g., 0.15 pF.

The layout arrangement of the top bitlines 240-243 in relative position with each other and with respect to the segment bitlines (SBL0) 240A, (SBL1) 240B, (SBL2) 241A, (SBL3) 241B, (SBL4) 242A, (SBL5) 242B, (SBL6) 243A, (SBL7) 243B are especially advantageous in reducing the bitline capacitance. The purpose is to make the top bitlines as truly floating as possible, hence the name of truly-floating-bitline scheme.

Figure 4:
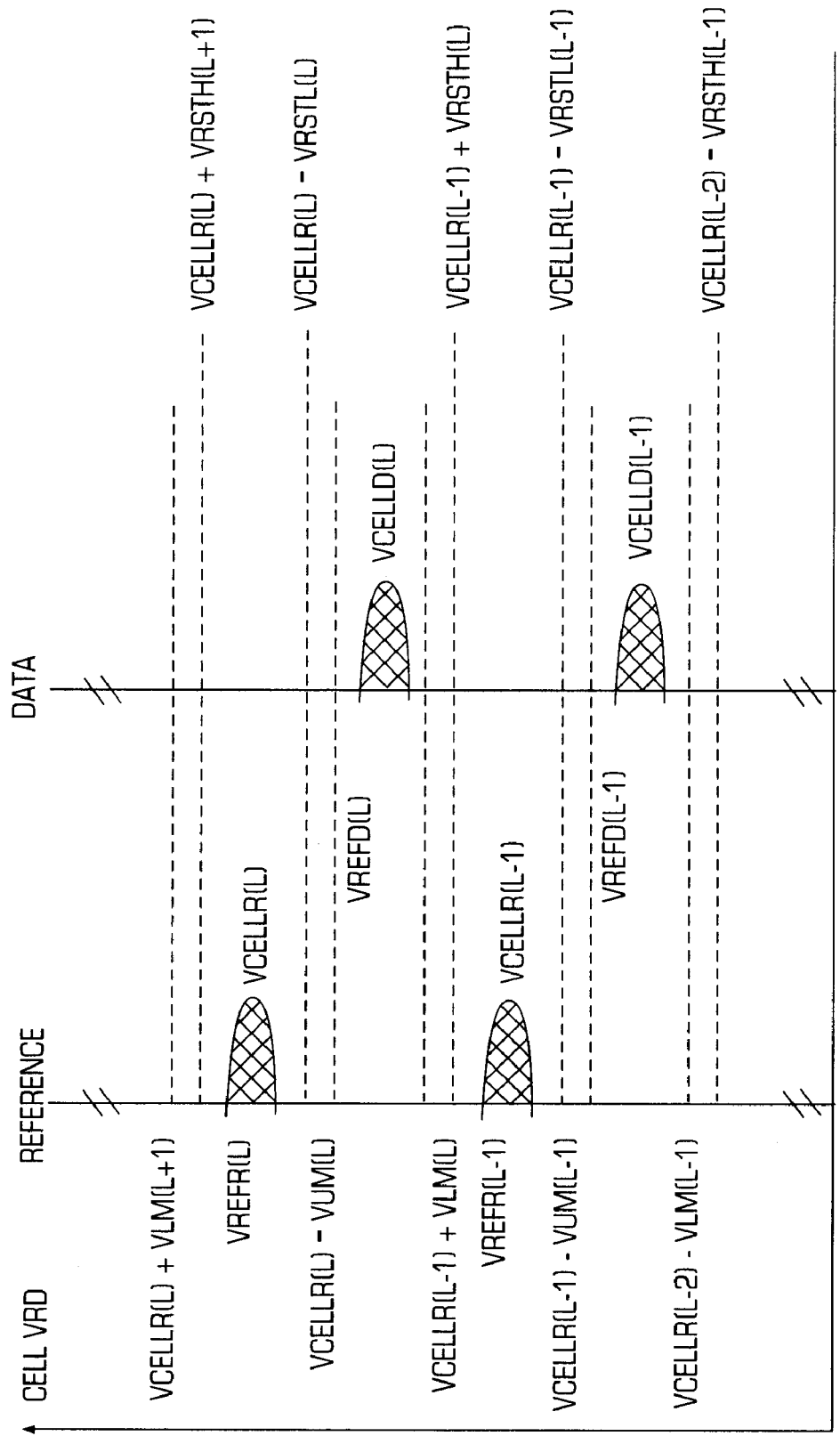
FIG. 4 is a diagram showing various voltages generated and used for program verifying, program upper and lower margin verifying, read sensing and restore high or restore low margin verifying during read sensing.

FIG. 4 shows various voltages generated and used in one embodiment of a memory system for program verifying, program upper and lower margin verifying, read sensing and restore high or restore low margin verifying during read sensing. The read sensing is advantageously performed in the voltage-mode but other modes of read sensing are also applicable. All the voltages are generated by the V&IREF block 172. VREFR(L) is the program verify voltage used to verify program level L of a reference cell. VREFD(L) is the program verify voltage used to verify program level L of a data cell. For example, in a 4 bit per cell storage embodiment there are 16 levels used. It is also possible to use 15 levels instead of 16 levels since the extreme low or high levels not need to be constrained to exact low or high levels but can go to ground or power supply, respectively. VREFR0 through VREFR15 are program verify voltages used for verifying programming of the reference cells. VREFD0 through VREFD15 are program verify voltages used for verifying programming of the data cells. VUM(L) and VLM(L) are upper and lower program margin verify voltages respectively for level L. Each level L may have its own VUM(L) and VLM(L) voltage values. VUM(L) and VLM(L) can each be of different value also for each level L. On the other hand, VUM(L) and VLM(L) can be of the same voltage value for all the levels. VUM(L) and VLM(L) voltages are generated by the block V&IREF 172. VRSTH(L) and VRSTL(L) are RESTORE HIGH and RESTORE LOW margin voltages respectively for level L. Each level L may have its own VRSTH(L) and VRSTL(L) voltage value. VRSTH(L) and VRSTL(L) can each be of different value also for each level L. On the other hand, VRSTH(L) and VRSTL(L) can be of the same voltage value for all the levels. VRSTH(L) and VRSTL(L) voltages are generated by the V&IREF 172 block. VCELLR(L) is the voltage read back from a reference cell during read sensing. VCELLD(L) is the voltage read back from a data cell during read sensing. The cross-hatched regions show the distribution of possible read back voltages during read sensing after reference cells or data cells have been programmed to a certain level L, while using VREFR(L) or VREFD(L) as the program verify voltage, respectively. The distributions occur because every cell does not have the same programming or read sensing characteristics.

The reference voltage generators of FIGS. 5 and 10-14 may be a part of the V&IREF block 172 (see FIG. 1).

Figure 5:
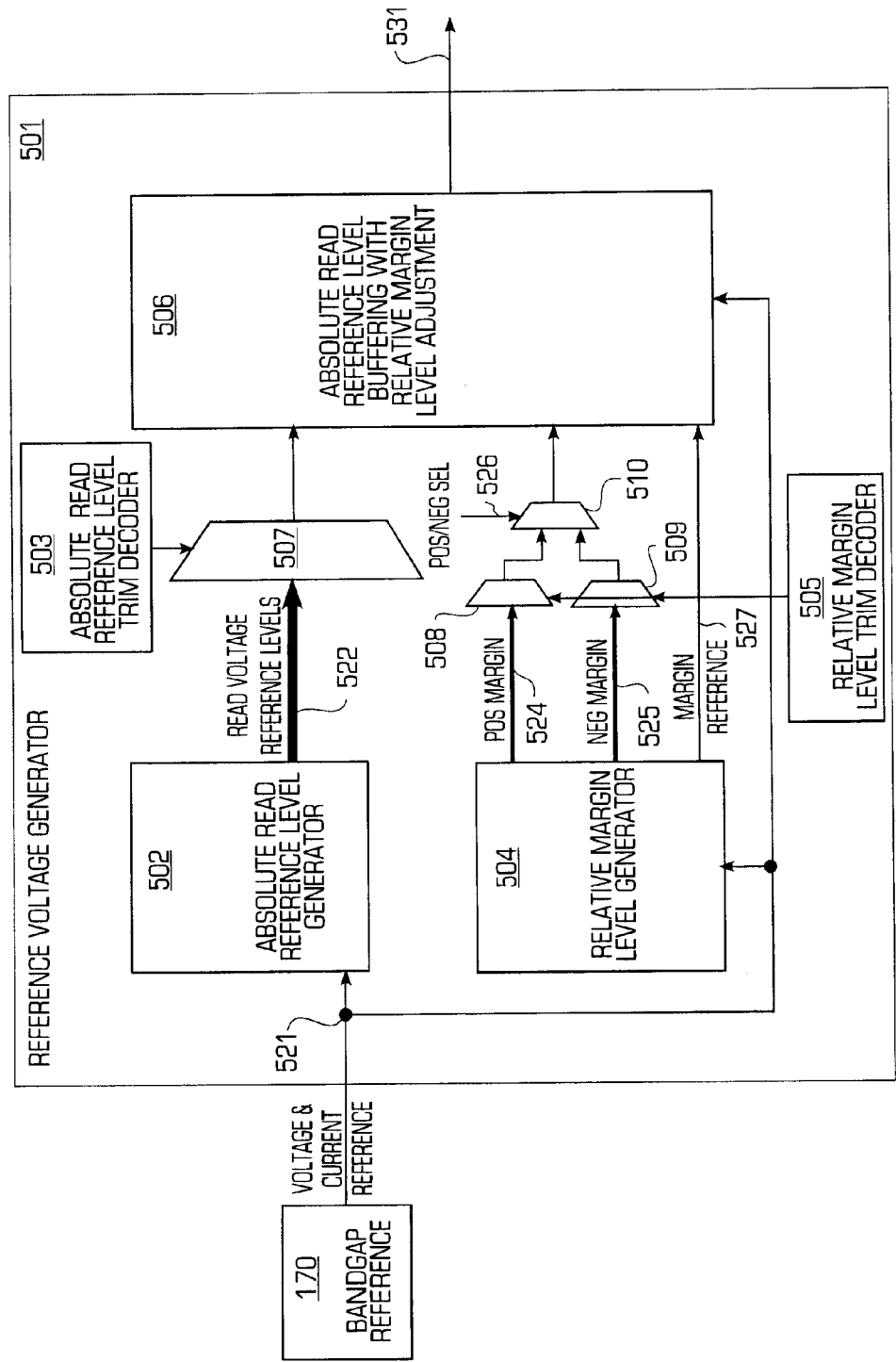
FIG. 5 is a block diagram illustrating a first embodiment of a reference voltage generator of the memory system of FIG. 1.

FIG. 5 is a block diagram illustrating a reference voltage generator 501.

In response to voltage and current references 521 received from the bandgap reference generator 170, the reference voltage generator 501 generates a plurality of adjustable reference voltage levels 531 with relative margin level adjustment. The reference voltage generator 501 comprises an absolute read reference level generator 502, an absolute read reference level trim decoder 503, a relative margin level generator 504, a relative margin level trim decoder 505, an absolute read reference level buffer 506 and a plurality of multiplexers 507 through 510.

The absolute read reference level generator 502 generates read reference voltage levels 522 (e.g., reference voltage level 0, 1, and 2 of FIG. 6) in response to the voltage and current references 521 from the bandgap reference generator 170. The bandgap reference generator 170 may be, for example, the bandgap reference generator described in U.S. Pat. No. 6,841,982, entitled "Curved Fractional CMOS Bandgap Reference", Inventor Hieu Van Tran, or the U.S. Pat. No. 6,943,617, entitled "Low Voltage CMOS Bandgap Reference", Inventors Hieu Van Tran, et al. The absolute read reference level generator 502 provides the read voltage levels 522 to the multiplexer 507. The absolute read reference level trim decoder 503 select the reference levels, such as shown in FIG. 7, which the multiplexer 507 outputs to the absolute read reference level buffer 506.

The reference margin level generator 504 generates positive margin levels 524 and negative margin levels 525, which are provided to the multiplexers 508 and 509, respectively. The multiplexer 510 selects the positive margin level 524 or the negative margin level 525 outputs from the multiplexers 508 and 509, respectively, in response to a positive/negative selection signal 526. The relative margin level generator 504 further provides a margin reference 527 to the absolute read reference level buffer 506. The relative margin level trim decoder 505 selects the relative margins, such as the margins 613 and 614 as shown in FIG. 6.

Figure 6:
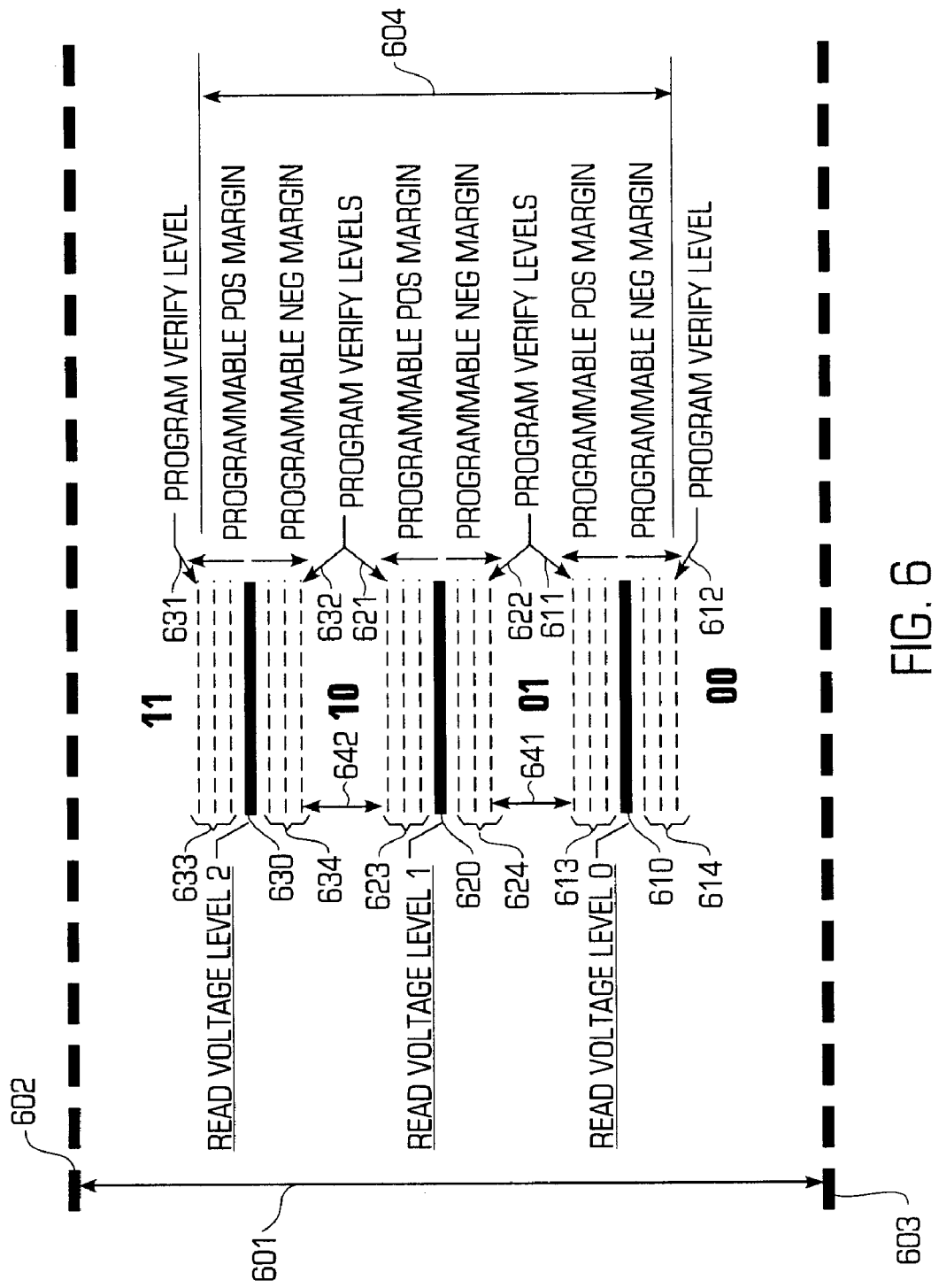
FIG. 6 is a diagram illustrating voltages for a 2-bit read window.
Figure 7:
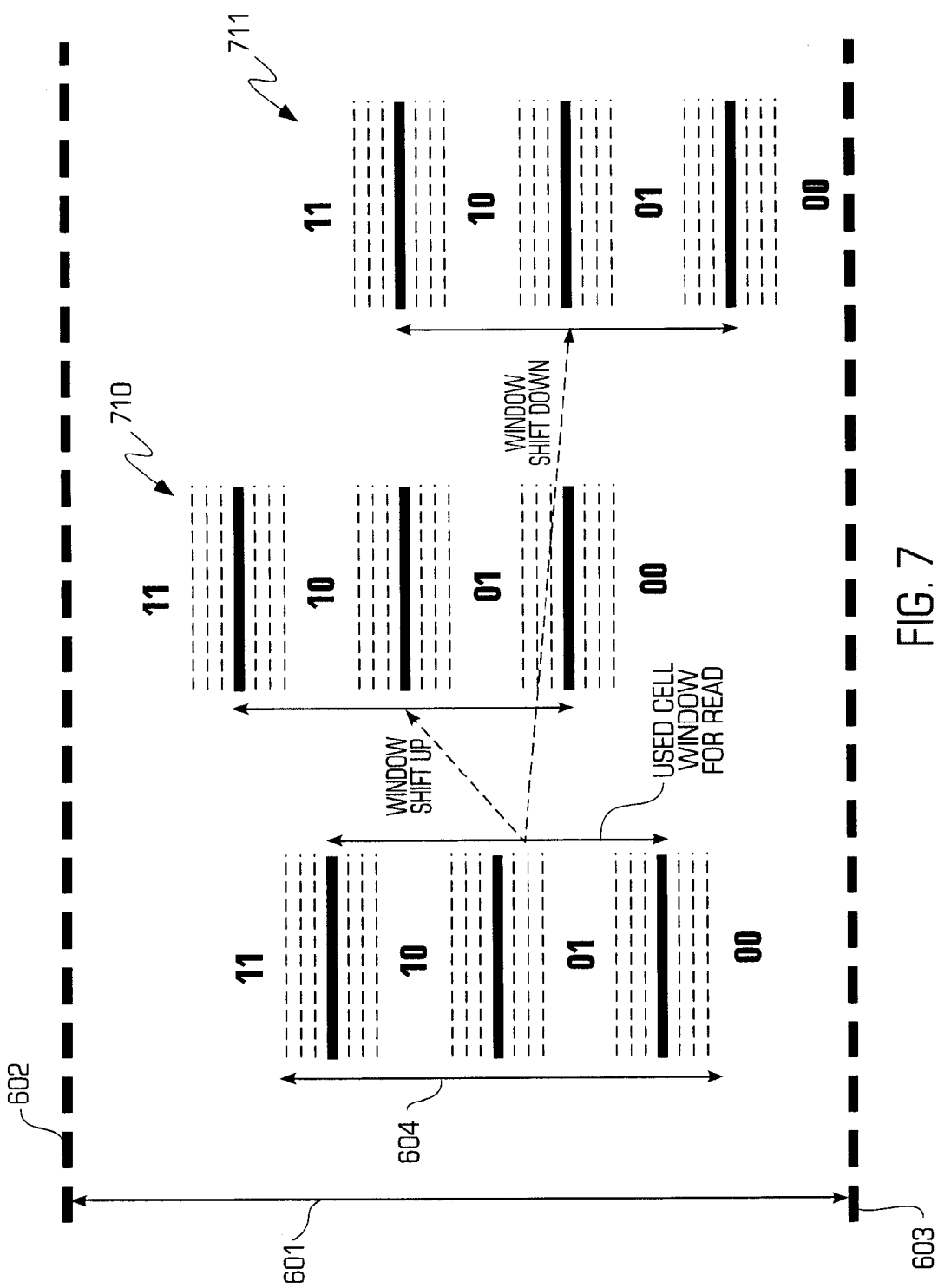
FIG. 7 is a diagram illustrating voltages for a programmable read level window shift up and down.

FIG. 6 is a diagram illustrating voltages for a two-bit read window.

A line 601 indicates the read window range of the multi-level memory cells. The range may depend on the floating gate voltage range or may depend on the sensing scheme. The read window range 601 is between an upper voltage 602 and a lower voltage 603. As an illustrative example, FIGS. 6-9 show a two-bit four level read window, but other numbers of bits may be used. In this example, three read voltage levels are generated, mainly read voltage level (0) 610, read voltage level (1) 620, and read voltage level (2) 630. The read voltage levels 0, 1, 2 divide the full voltage range 601 into subranges in which the data value stored in the data cell is determined to correspond to the stored data. In the illustrative example of 2-bits, the read voltage levels 2, 1, 0 define ranges of data voltages corresponding to the data values 11, 10, 01, and 00. Each read voltage level 0, 1, 2 has an upper program verify level and a lower program verify level. Specifically, the read voltage levels 0, 1, 2 have an upper program verify level 611, 621, and 631, respectively. The read voltage level 0, 1, and 2 have a lower program verify levels 612, 622, and 632, respectively. Each read voltage level 0, 1, 2 has a corresponding programmable positive margin and a programmable negative margin. Specifically, the read voltage levels 0, 1, and 2 have a programmable positive margin 613, 623, and 633, respectively. Each read voltage level 0, 1, and 2 has a programmable negative margin 614, 624, and 634, respectively. The programmable positive margins 613, 623, and 633 may be different from each other. The programmable negative margins 614, 624, and 634 may be different from each other, and different from the programmable positive margins 613, 623, and 633.

The read voltage reference levels 522 correspond to the read voltage levels 0, 1, 2 of FIG. 6. The positive margin signals 524 correspond to the programmable positive margin signals 613, 623, 633. The negative margin signals 525 correspond to the programmable negative margin signals 614, 624, 634.

FIG. 7 is a diagram illustrating voltages for a programmable read level window shift up and down.

The voltage range 604 may be the same as shown in the illustrative embodiment of FIG. 7. For the sake of clarity, reference numbers for the read voltage levels, programmable margin levels and the program verify levels are not shown in FIG. 7. In this embodiment, the voltage range 604 may be shifted within the voltage range 601. The shift may be up for the range 710 or may be down for the voltage range 711.

Referring again to FIG. 5, the absolute read reference level trim decoder 503 controls the multiplexer 507 to select the read voltage reference levels to thereby generate the shifts of the window range 604 to be one of the ranges 710 or 711.

Figure 8:
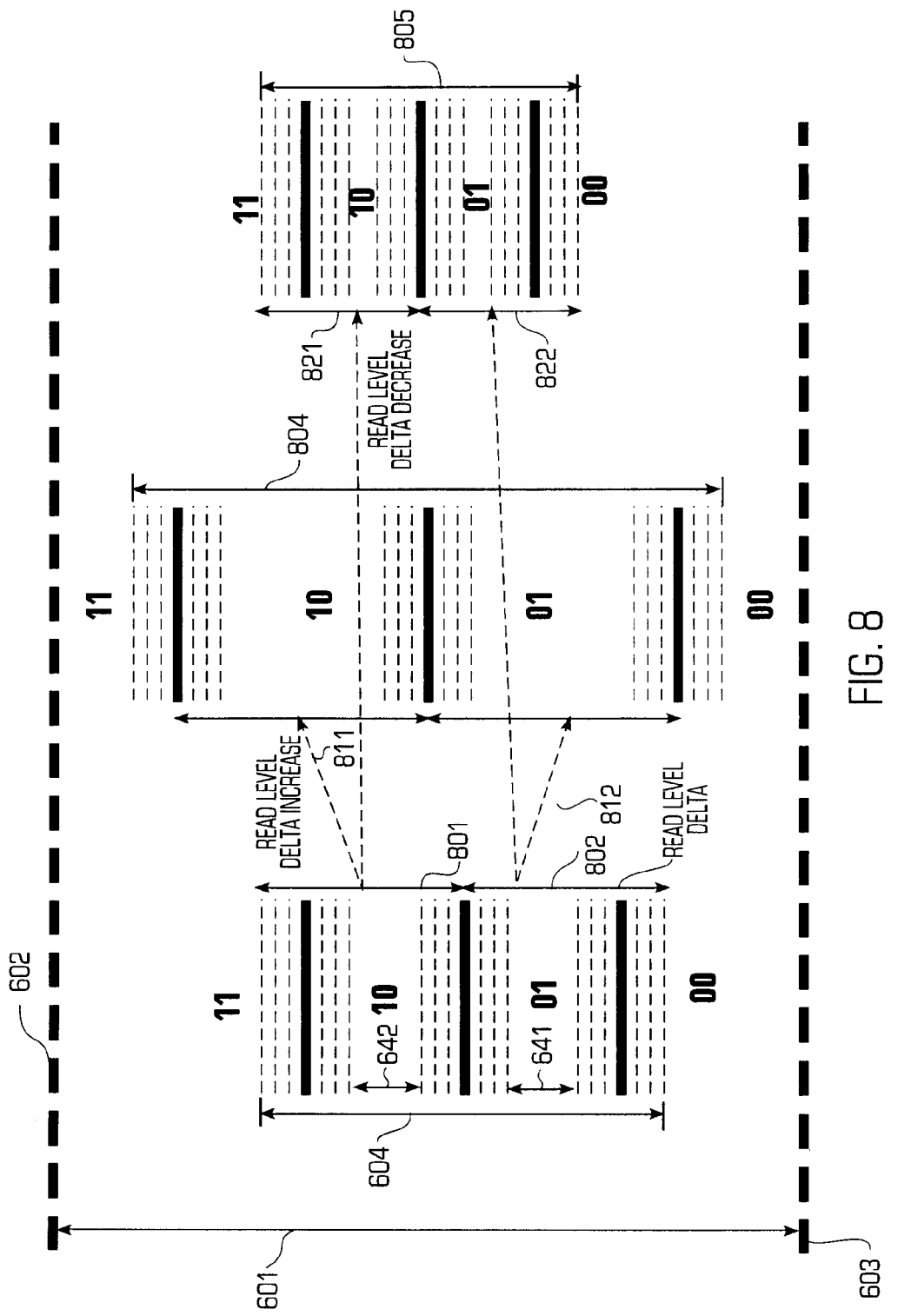
FIG. 8 is a diagram illustrating voltages for a programmable read level having a delta increase or decrease.

FIG. 8 is a diagram illustrating voltages for a programmable read level having a delta increase or decrease. For the sake of clarity, reference numbers for the read voltage levels, programmable margin levels and the program verify levels are not shown in FIG. 8.

In this embodiment, the read voltage levels 0, 1, 2 are shifted so that the difference 801 and 802 between read levels may be increased to read level differences 811 and 812, respectively, to form a voltage read range 804. The read voltage level 0, 1, 2 may be decreased so that the read levels 801 and 802 are decreased to form read levels 821 and 822, respectively, to form a smaller read voltage range 805.

Referring again to FIG. 5, the shift in the voltage read levels may be done by the absolute read reference level trim decoder 503 that selects appropriate read voltage reference levels 522 that cause the increase or decrease between the read levels.

Figure 9:
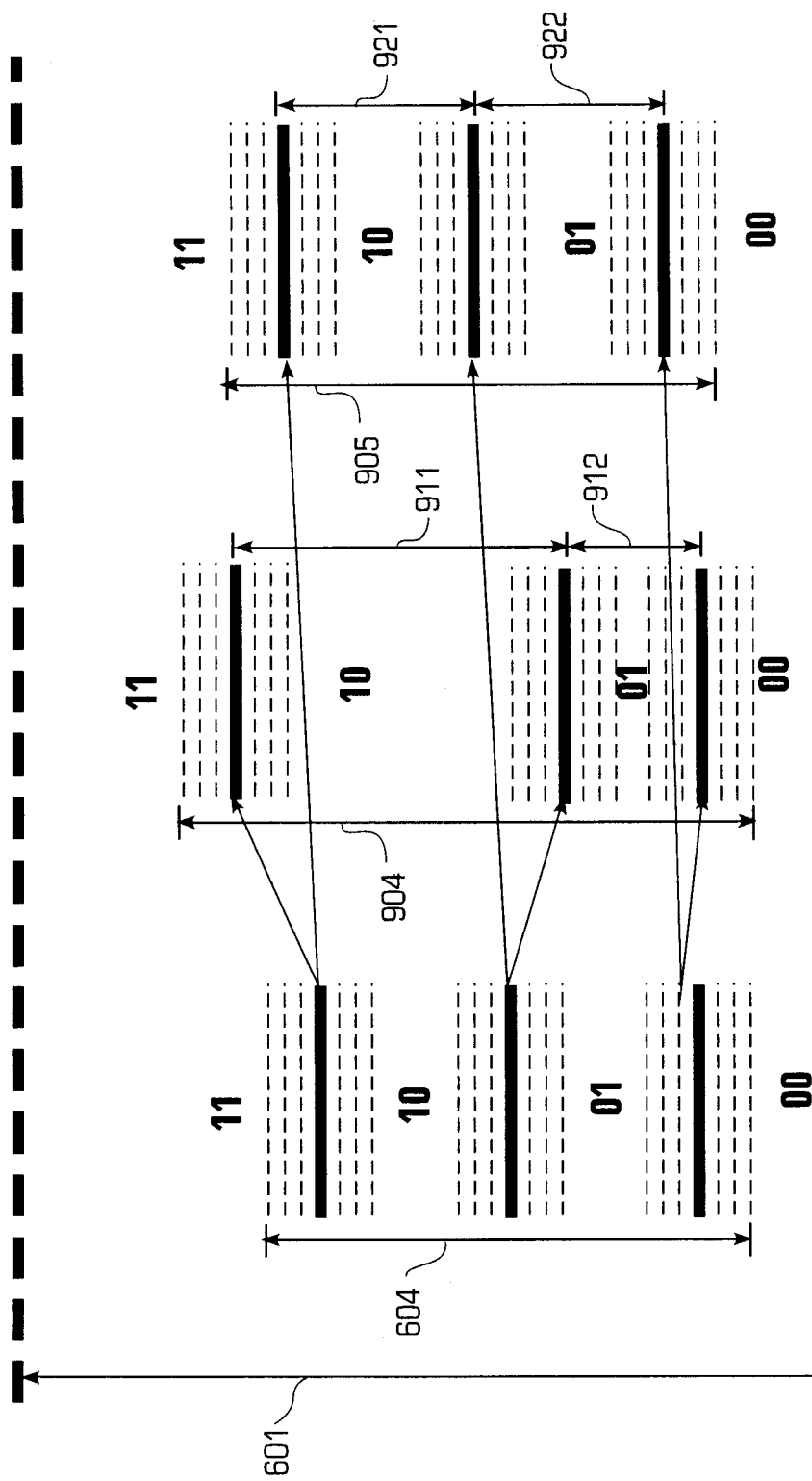
FIG. 9 is a diagram illustrating voltages for an independent read level control.

FIG. 9 is a diagram illustrating voltages for an independent read level control. For the sake of clarity, reference numbers for the read voltage levels, programmable margin levels and the program verify levels are not shown in FIG. 9.

In this embodiment, the reference read levels 0, 1, 2 may be adjusted independent of each other so that the voltage 604, which is adjusted to a voltage range 904 and 905, has reference levels that may be increased or decreased or both. For example, the voltage range 905 is for reference levels that have a read level range 911 that differs from a read range 912. Similarly, a read voltage range 905 includes a read range 921 and 922 with the range 921 being smaller than the range 922.

Figure 10:
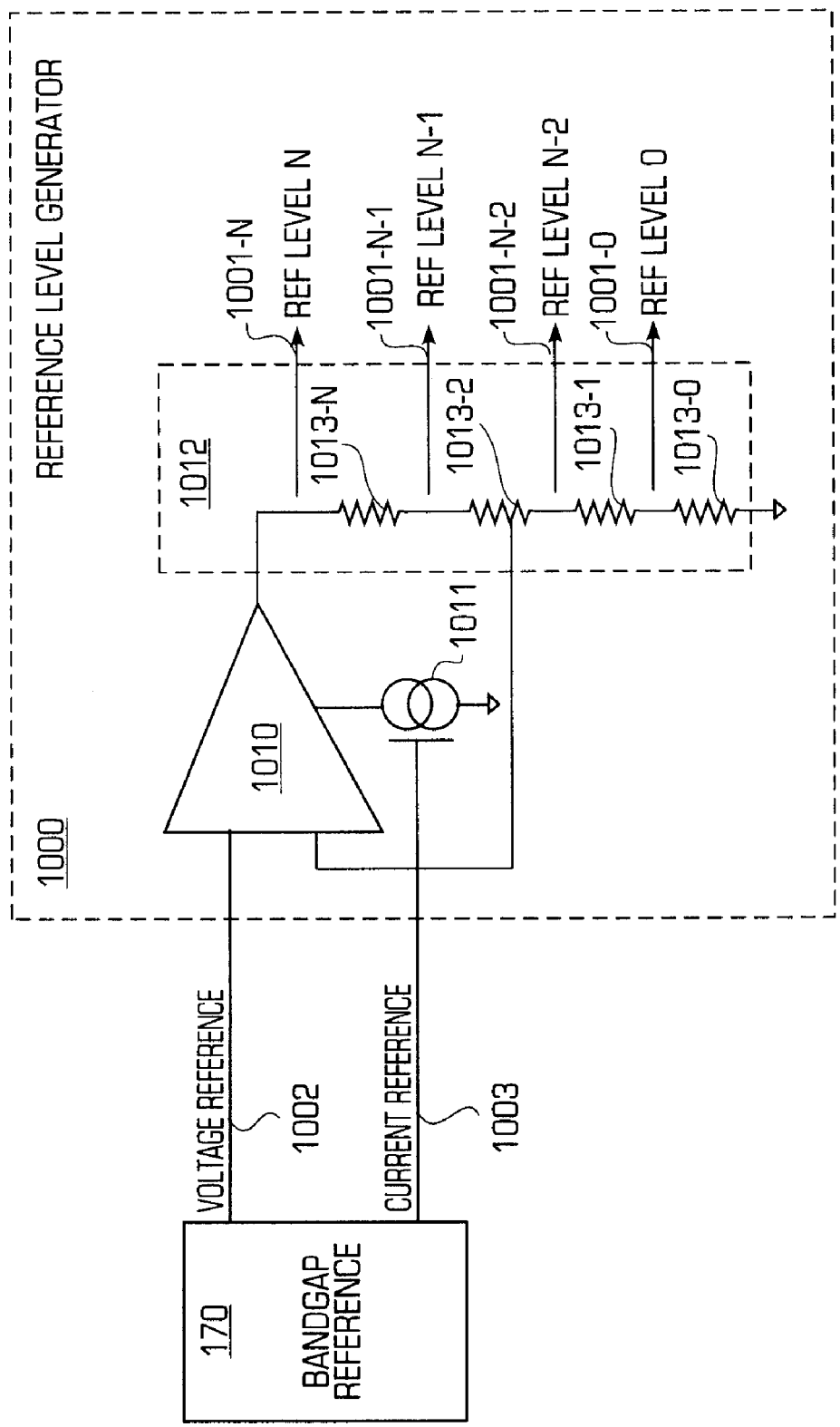
FIG. 10 is a block diagram illustrating a second embodiment of the reference level generator of the memory system of FIG. 1.

FIG. 10 is a block diagram of a reference level generator 1000.

The reference level generator 1000 generates a plurality of reference levels 1001-0 through 1001-N in response to a voltage reference 1002 and a current reference 1003 from the bandgap reference generator 170. The absolute read reference level generator 502 (see FIG. 5) may include the reference level generator 1000. The reference level generator 1000 comprises an operational amplifier 1010, a current source 1011, and a voltage divider 1012. The current source 1011 is biased by the current reference 1003 and provides a current to the operational amplifier 1010. The voltage divider 1012 is coupled between an output of the operational amplifier 1010 and ground and provides feedback to the operational amplifier 1010. The voltage divider 1012 generates reference voltage levels 1001-0 through 1001-N. The voltage divider 1012 comprises a plurality of series coupled resistors 1013-0 through 1013-N. The resistors 1013 may be fixed or variable resistors.

Figure 11:
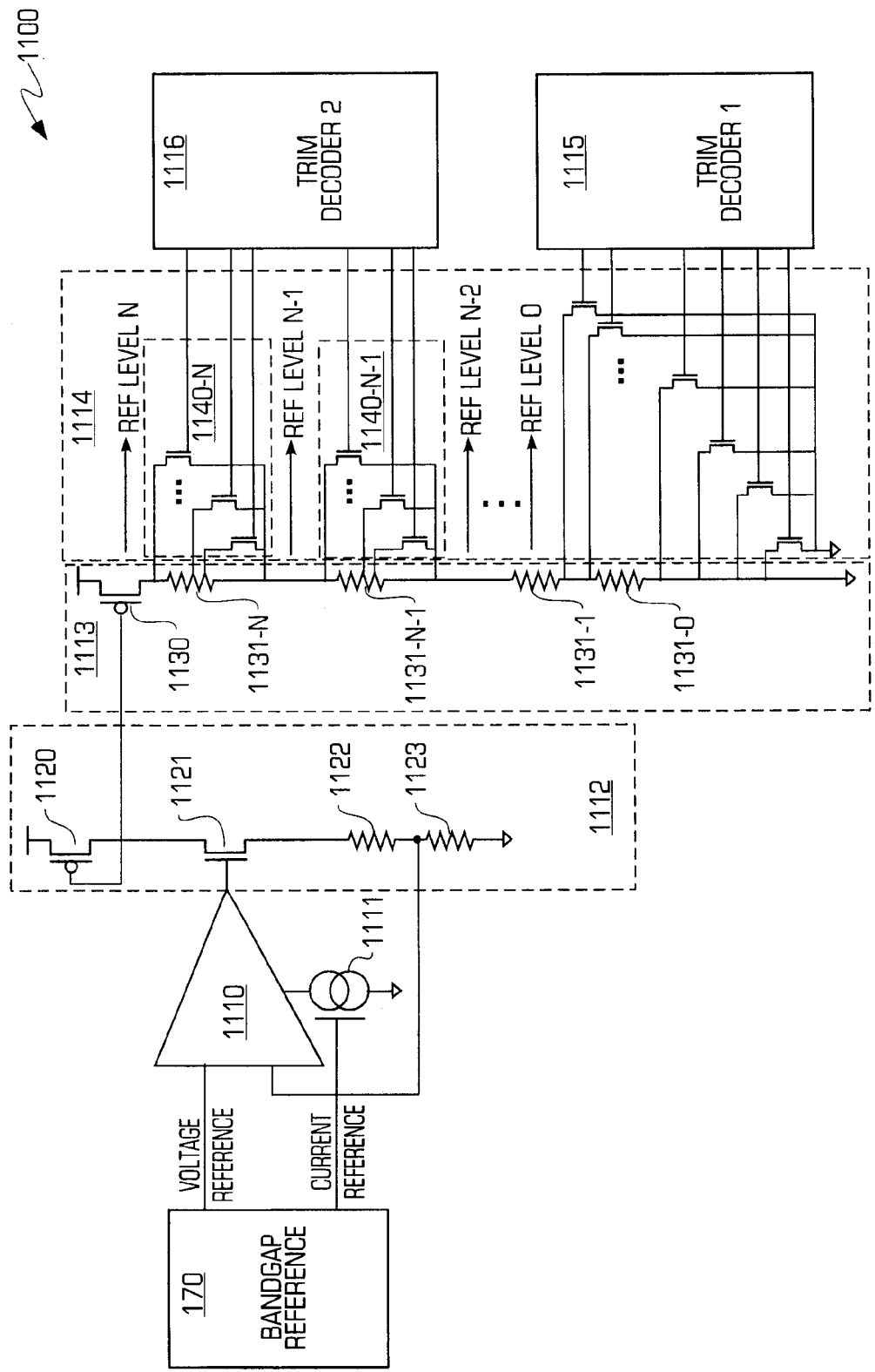
FIG. 11 is a block diagram illustrating a third embodiment of a read reference level generator of the memory system of FIG. 1.

FIG. 11 is a block diagram illustrating the read reference level generator 1100.

The read reference generator 1100 comprises an operational amplifier 1110, a current source 1111, a voltage divider circuit 1112, a mirror circuit 1113, and a plurality of trim decoders 1115 and 1116. The voltage divider circuit 1112 generates a biased voltage for controlling the mirror circuit 1113 which generates the reference voltage levels 0-N. The voltage divider circuit 1112 generates a stable current with negative feedback to the operational amplifier 1110. The voltage divider circuit 1112 comprises a diode connected PMOS transistor 1120, an NMOS transistor 1121, a plurality of resistors 1122 and 1123 coupled in series between a supply voltage and ground. The node formed between terminals of the resistors 1122 and 1123 is coupled to the second input of the operational amplifier 1110 for negative feedback. The gate of the NMOS transistor 1121 is biased by the output of the operational amplifier 1110. The mirror circuit 1113 mirrors the current flowing through the voltage divider 1112. The mirror circuit 1113 comprises a PMOS transistor 1230 and a plurality of transistors 1131-0-1331-N coupled in series between a supply voltage and ground. The gate of the PMOS transistor 1230 is biased by the drain of the PMOS 1120 to mirror the current in the voltage divider 1112. The resistors 1131 form a voltage divider for generating the reference level 0-N from the respective resistor 1131-0-1131-N. In one embodiment, the resistors 1131 are trimmable resistors. The mirror circuit 1113 comprises a selection circuit 1114 for selecting the trim of the trimmable resistors 1131. Specifically, for each resistor 1131 there is an associated plurality of transistors 1140-0-1140-N that selectively shorts portions of the trimmable resistor 1131 to adjust the resistance of the resistor 1131. The trim decoders 1115 and 1116 provide the selection control signals to the gates of the transistors 1140 for controlling the resistance of the trim resistors 1131.

Figure 12:
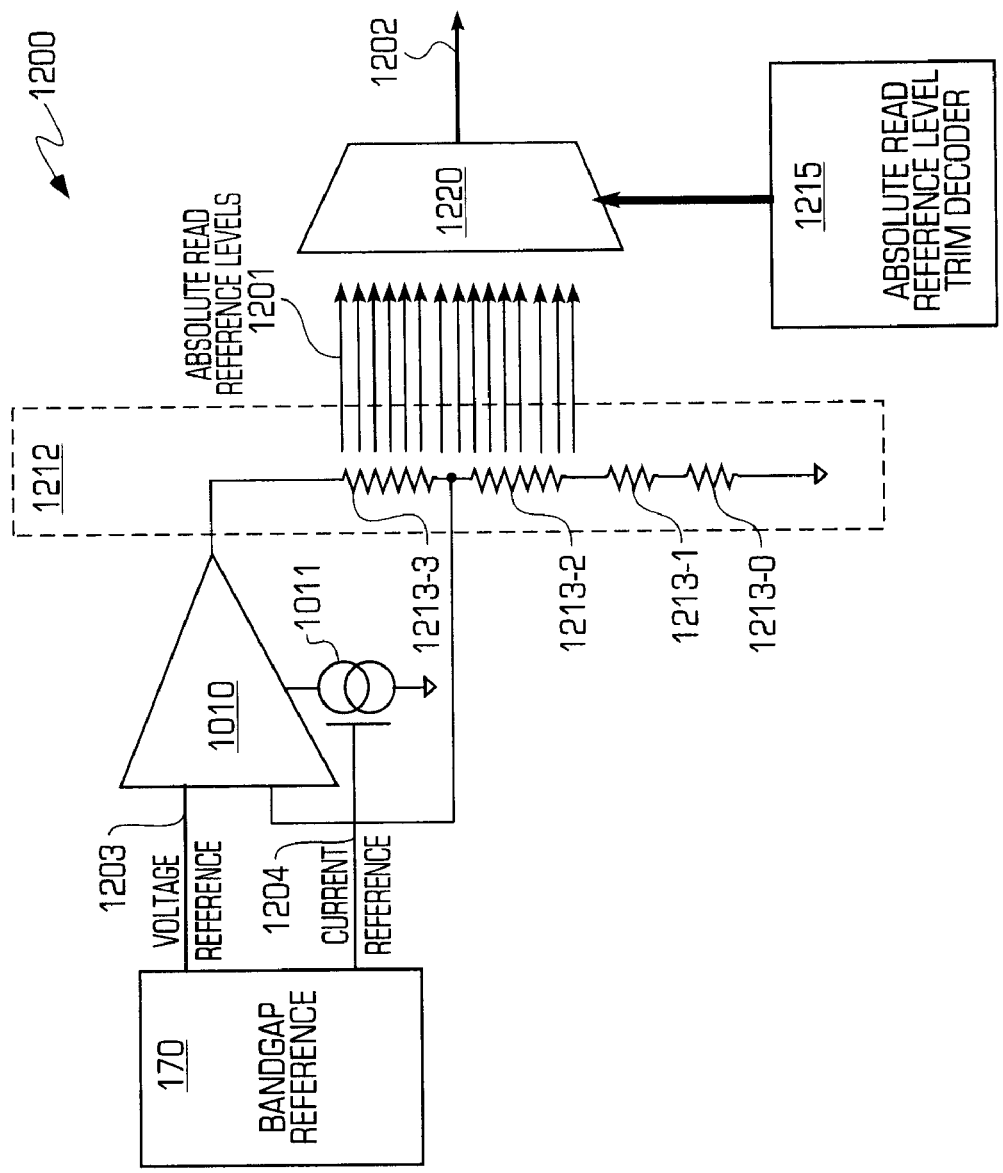
FIG. 12 is a block diagram illustrating a fourth embodiment of a reference voltage generator of the memory system of FIG. 1.

FIG. 12 is a block diagram of a reference level generator 1200.

The reference level generator 1201 generates a plurality of reference levels that are then selected to provide an output absolute read reference level 1202 in response to a voltage reference 1203 and a current reference 1204 from the bandgap reference generator 170. The absolute read reference level generator 502 (see FIG. 5) may include the reference level generator 1200. The reference level generator 1200 comprises an operational amplifier 1010 and a bias current source 1011 that are arranged in the similar manner as the reference level generator 1000 (FIG. 10). The reference level generator 1200 further comprises a voltage divider 1212 that includes a plurality of resisters 1213-0 through 1213-3 that are coupled in series between the output of the operational amplifier 1010 and ground. The voltage divider 1212 is a coupled in a similar manner as a voltage divider 1012 (FIG. 10) with a feedback voltage to the operational amplifier 1010 from the resister 1213-3. The resisters 1213 are trimmable to provide the absolute read reference levels 1201. The reference level generator 1200 further comprises a multiplexer 1220 that selects the absolute read reference levels 1201 to provide the absolute read reference level 1202 in response to control signals from an absolute read reference trim decoder 1215.

Figure 13:
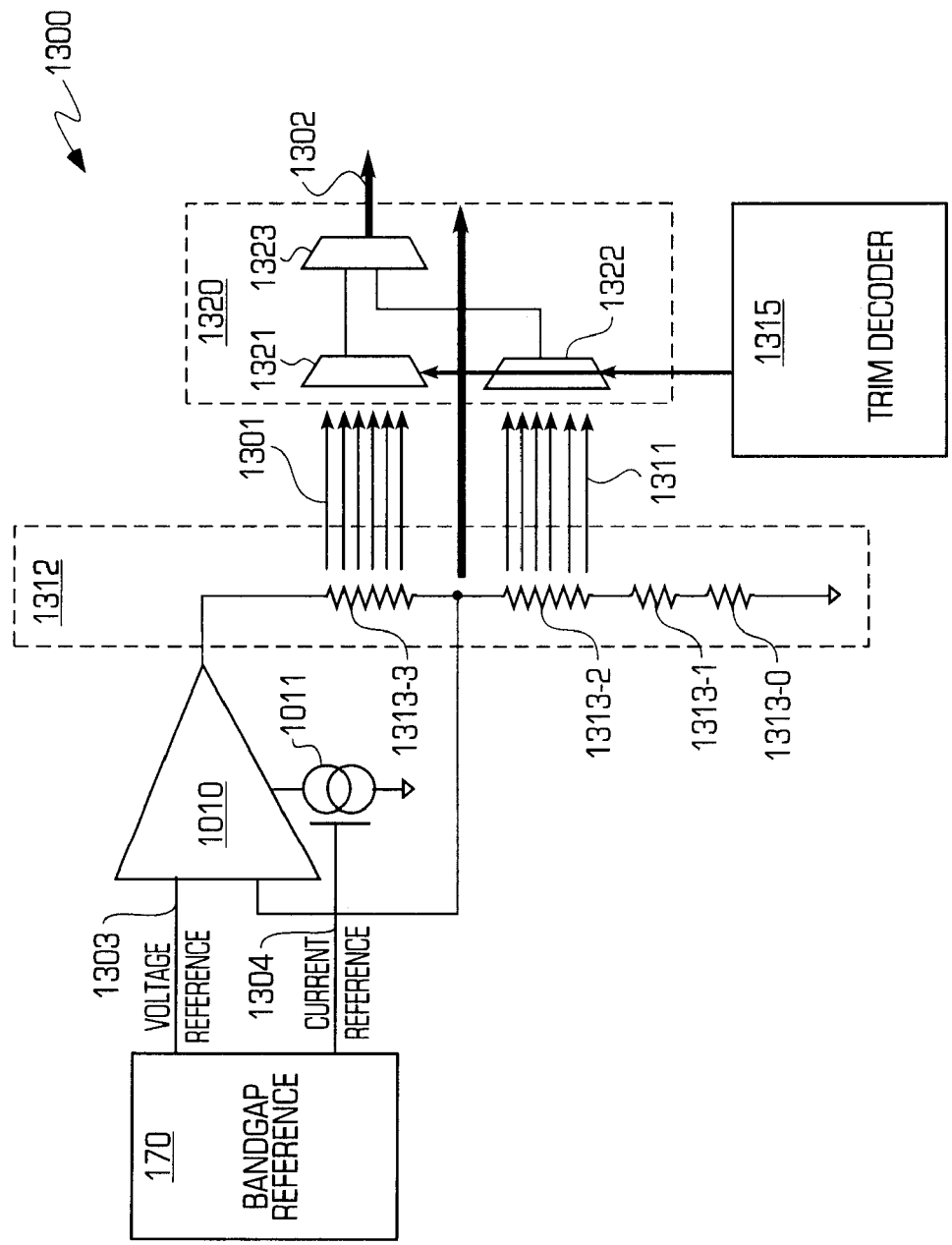
FIG. 13 is block diagram illustrating a fifth embodiment of a reference voltage generator of the memory system of FIG. 1.

FIG. 13 is a block diagram illustrating a read reference level generator 1300.

The reference level generator 1300 generates a relative margin level 1302 in response to a voltage reference 1303 and a current reference 1304 from the bandgap reference generator 170. The reference level generator 1300 comprises an operational amplifier 1010 and a current source 1011 configured in a similar manner as the reference level generator 1000 (FIG. 10). The reference level generator 1300 further comprises a voltage divider 1312 arranged in the similar manner as the voltage divider 1212 of the reference level generator 1200 (FIG. 12), but generates a relative positive margin 1301 and a relative negative margin 1311, which are applied to a multiplexer 1320. The voltage divider 1312 comprises a plurality of series coupled resisters 1313-0 through 1313-3. The trimmable resister 1313-3 provides the relative positive margin level 1301 to a positive margin multiplexer 1321 of the multiplexer 1320. The trimmable resister 1312-2 provides the relative negative margin level signals 1311 to a negative margin multiplexer 1322 of the multiplexer 1320. A trim decoder 1315 selects the relative positive margin level 1301 and a relative negative margin level 1311 and provides the selected level to the positive/negative select multiplexer 1323 of the multiplexer 1320, to generate the relative margin level 1302.

Figure 14:
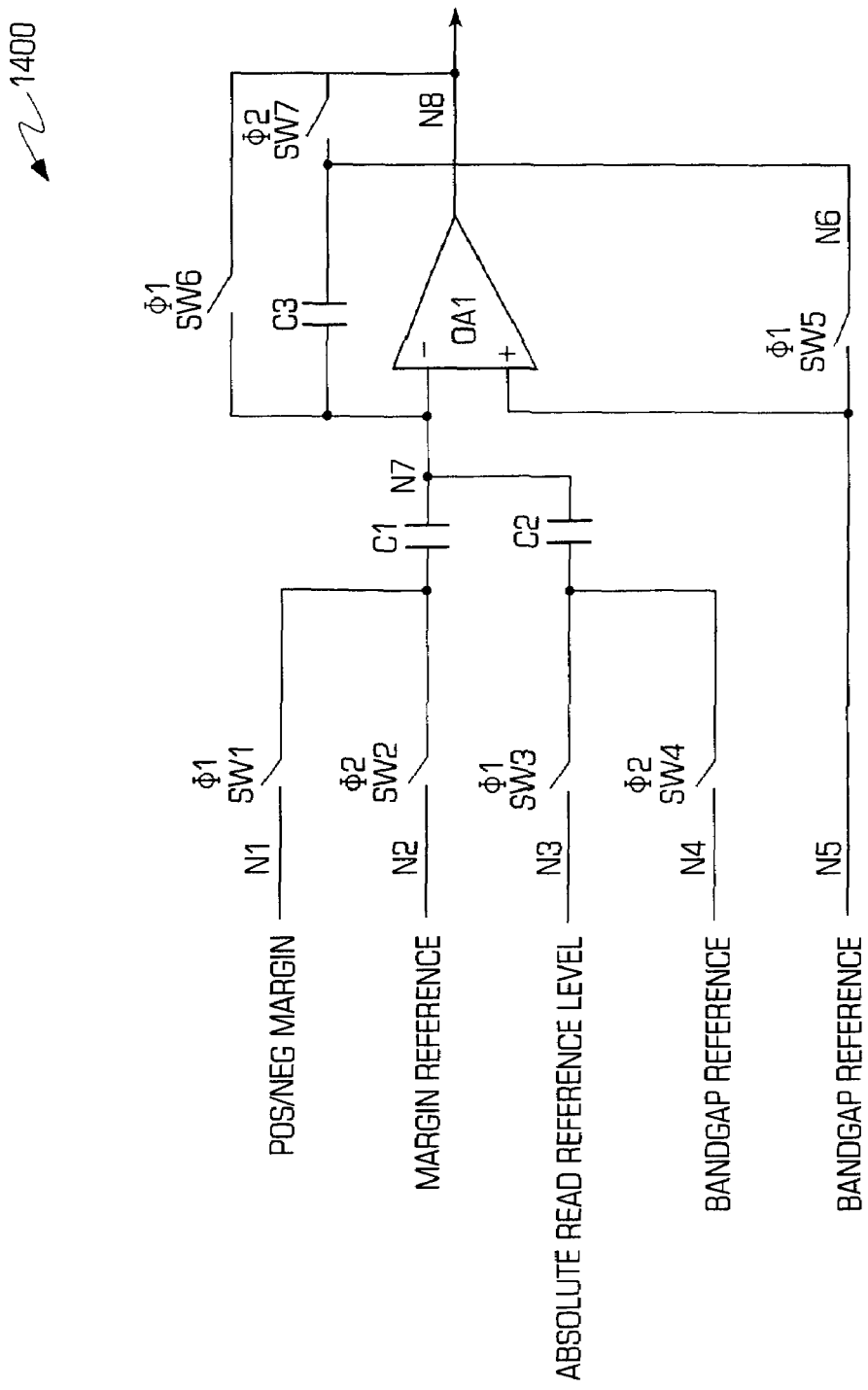
FIG. 14 is a block diagram illustrating a reference level buffer of the memory system of FIG. 1.

FIG. 14 is a diagram illustrating an absolute read level reference level buffering circuit 1400.

The buffering circuit 1400 comprises an operational amplifier array OA1, a plurality of capacitors C1, C2, and C3 and a plurality of switches SW1, SW2, SW3, SW4, SW5, SW6, and SW7. The switches SW1, SW3, SW5 and SW6 are referred to as phase I ($\Phi 1$) switches. The switches SW2, SW4, and SW7 are referred to as phase II ($\Phi 2$) switches. The operation of the buffering circuit 1400 is now described. During the phase-I time, all the phase I switches are ON (closed) and the phase II switches are OFF (open). During the phase-II time, all phase II switches are ON and all phase I switches are OFF. The phase I switches are turned ON for an autozero and to set up an initial voltage condition. During the phase II, the output of the operational amplifier OA1 is driven to the read reference level adjusted by the margin level.

The operation is further described. During the phase I interval, an offset voltage is stored across the capacitor C3. The bandgap (BGP) voltage plus an opamp offset voltage is set on a node N7, which is coupled to an input of the operational amplifier OA1. A node N1 is driven with the positive/negative margin voltage (positive or negative with respect to margin reference voltage). The current flow through the capacitor C1 ensures that the voltage on the node N1 minus the voltage on the node N7 is stored as a charge across the capacitor C1. Similarly a node N3 is driven by the absolute read reference voltage. Current flow through the capacitor C2 ensures that the voltage on the node N3 minus the voltage on the node N7 is charged across the capacitor C2. During phase I, the bandgap voltage is driven on an output node N8, which is coupled to the output of the operational amplifier OA1, because the switch SW6 is ON and the operational amplifier array OA1 is in a unity gain configuration. During phase II, the switch SW4 is ON and the bandgap reference voltage is forced at one end of the capacitor C2 causing current flow through the capacitor C1. Because the node N7 is fixed, the current flows through the capacitor C3 adjusting the output read voltage reference voltage on the node N8 (the output of the operational amplifier array OA1) appropriately for the positive or negative margin depending on the case.

In the foregoing description, various methods and apparatus, and specific embodiments are described. However, it should be obvious to one conversant in the art, various alternatives, modifications, and changes may be possible without departing from the spirit and the scope of the invention which is defined by the metes and bounds of the appended claims.

What is claimed is:

1. A reference voltage generator comprising:
   an absolute read reference level generator providing a plurality of read voltage reference levels in response to a voltage reference;
   an absolute read reference level trim decoder providing a first selection signal indicative of an absolute read reference level;
   a first multiplexer coupled to the absolute read reference level generator to provide a selected read voltage reference level in response to the first selection signal;

a relative margin level generator providing a plurality of positive margin signals, a plurality of negative margin signals, and a margin reference in response to the voltage reference;

a second multiplexer for selecting ones of said positive margin signals and negative margin signals in response to a second selection signal; and a relative margin level trimmed decoder providing the second selection signal indicative of a relative margin level.

2. The reference voltage generator of claim 1 wherein the absolute read reference level generator comprises:

an operational amplifier including a first input to receive the voltage reference, including a second input, and including an output;

a current source coupled to the operational amplifier to provide a current thereto in response to a current reference;

a voltage divider coupled between the output of the operational amplifier and a ground node and to the second input of the operational amplifier, and including a plurality of outputs to provide said plurality of read voltage reference levels.

3. The reference voltage generator of claim 2 wherein the voltage divider comprises a plurality of resistors coupled in series between the output of the operational amplifier and the ground node and including terminals coupled to said resistors for providing said plurality of read voltage reference levels and another terminal coupled to the second input of the operational amplifier.

4. The reference voltage generator of claim 1 wherein the absolute read reference level generator comprises:

an operational amplifier including a first input to receive the voltage reference, including a second input, and including an output;

a current source coupled to the operational amplifier to provide a current thereto in response to a current reference; and first and second voltage dividers, the first voltage divider coupled to the output and the second input of the operational amplifier to control a biased voltage, the second voltage divider mirroring a current in the first voltage divider in response to the biased voltage, the second voltage divider providing the plurality of read voltage reference levels.

5. The reference voltage generator of claim 4 wherein the first voltage divider comprises a first diode connected PMOS transistor, a NMOS transistor, and a plurality of first resistors.

6. The reference voltage generator of claim 1 wherein the absolute read reference level generator comprises:

an operational amplifier including a first input to receive the voltage reference, including a second input, and including an output;

a current source coupled to the operational amplifier to provide a current thereto in response to a current reference;

a voltage divider including a first input coupled to the output of the operational amplifier, including a second input for coupling to ground, including a first output coupled to the second input of the operational amplifier, and including a plurality of second outputs for providing a respective one of a plurality of read reference levels;

wherein said first multiplexer includes a selection circuit including a plurality of inputs coupled to the plurality of second outputs of the voltage divider and includes an output for providing one of said plurality of read reference levels applied to a corresponding input in response to the first selection signal.

7. The reference voltage generator of claim 6 wherein the absolute read reference level further comprises a read reference level trim decoder including an output for providing the first selection signal.

8. The reference voltage generator of claim 1 wherein the relative margin level generator comprises:

an operational amplifier including a first input to receive the voltage reference, including a second input, and including an output;

a current source coupled to the operational amplifier to provide a current thereto in response to a current reference;

a voltage divider coupled between the output of the operational amplifier and a ground node, including a first output coupled to the second input of the operational amplifier to provide a first divided voltage, including a plurality of second outputs for providing a plurality of relative positive margin signals, and including a plurality of third outputs for providing a plurality of relative negative margin signals; and said second multiplexer includes a selection circuit including a plurality of inputs coupled to respective ones of the pluralities of second and third outputs of the voltage divider and includes an output for providing one of said plurality of relative positive margin signals or one of said plurality of relative negative margin signals in response to the selection signal.

9. The reference voltage generator of claim 8 wherein the relative margin level generator further comprises a trim decoder including an output for providing the selection signal.

10. The reference voltage generator of claim 8 wherein the selection multiplexer comprises:

a third multiplexer providing a selected one of the plurality of relative positive margin signals in response to the second selection signal;

a fourth multiplexer providing a selected one of the plurality of relative negative margin signals in response to a third selection signal; and a fifth multiplexer providing one of the selected margin signals in response to a fourth selection signal.

11. The reference voltage generator of claim 1 further comprising an absolute read reference level buffer coupled to the first and second multiplexers to provide read reference level in response to a third selection signal.

12. The reference voltage generator of claim 11 wherein the absolute read reference level buffer comprises:

an operational amplifier including a first input, including a second input coupled to receive the voltage reference, and including an output; and a switching circuit.

* * * * *